(12) United States Patent
Asterland

(10) Patent No.: US 8,779,298 B2
(45) Date of Patent: Jul. 15, 2014

(54) ELECTRONIC CIRCUIT

(75) Inventor: Richard Asterland, Trelleborg (SE)

(73) Assignee: St-Ericsson SA, Plan-les-Ouates (CH)

( * ) Notice: Subject to any disclaimer, the term of this patent is extended or adjusted under 35 U.S.C. 154(b) by 169 days.

(21) Appl. No.: 13/387,421

(22) PCT Filed: Jun. 17, 2010

(86) PCT No.: PCT/EP2010/058530
§ 371 (c)(1),
(2), (4) Date: Mar. 9, 2012

(87) PCT Pub. No.: WO2011/012372
PCT Pub. Date: Feb. 3, 2011

(65) Prior Publication Data
US 2012/0184326 A1 Jul. 19, 2012

Related U.S. Application Data

(60) Provisional application No. 61/234,055, filed on Aug. 14, 2009.

(30) Foreign Application Priority Data

Jul. 31, 2009 (EP) ...................................... 09166986

(51) Int. Cl.
*H05K 1/00* (2006.01)
(52) U.S. Cl.
USPC ........................................................ 174/258

(58) Field of Classification Search
USPC ......................................................... 174/258
See application file for complete search history.

(56) References Cited

U.S. PATENT DOCUMENTS

| 5,428,506 | A  | * | 6/1995  | Brown et al. ................. 361/794 |
| 5,981,869 | A  | * | 11/1999 | Kroger .......................... 174/388 |
| 6,180,215 | B1 |   | 1/2001  | Sprietsma et al. |
| 6,798,666 | B1 | * | 9/2004  | Alexander et al. ............ 361/766 |
| 7,213,739 | B2 | * | 5/2007  | Wilson et al. ............. 228/180.22 |
| 2006/0029217 | A1 | * | 2/2006  | Hayes ...................... 379/433.01 |
| 2007/0102806 | A1 |   | 5/2007  | Horn et al. |
| 2007/0133182 | A1 |   | 6/2007  | Chen et al. |
| 2007/0164435 | A1 |   | 7/2007  | Koshiishi et al. |

OTHER PUBLICATIONS

International Search Report issued in corresponding International Application No. PCT/EP2010/058530, mailed Dec. 2, 2010.

* cited by examiner

*Primary Examiner* — Jeremy C Norris
(74) *Attorney, Agent, or Firm* — Patent Portfolio Builders PLLC

(57) ABSTRACT

Electronic circuits (1, 101) are disclosed. The electronic circuits comprise a first and a second integrated circuit (10a, 110a, 10b, 110b) and a printed circuit board (PCB) (15, 115). The PCB comprises dielectric layers (30a-c, 130) of polymer-based materials having different dissipation factors arranged in accordance with various embodiments for suppressing noise.

13 Claims, 2 Drawing Sheets

ELECTRONIC CIRCUIT

TECHNICAL FIELD

The present invention relates to electronic circuits comprising a printed circuit board having an insulation layer comprising polymer material.

BACKGROUND

Electronic circuits may be constructed from electronic components, such as integrated circuits (ICs), discrete active components (e.g. transistors), discrete passive components (e.g. capacitors, resistors, inductors, and/or diodes), and/or various types of connectors, etc. These electronic components may be mounted onto a printed circuit board (PCB), which is normally built up from electrically conductive layers forming wires for electrically connecting the electronic components, and of insulating dielectric layers arranged between the electrically conductive layers. In order to facilitate the use of relatively high signal frequencies (e.g. for bit-serial digital signals with relatively high bitrates) in the wires, it is normally desirable to use dielectric layers with relatively low dissipation factor. Furthermore, power-supply planes are normally formed in various ones of the electrically conductive layers for supplying different supply voltages, such as ground (or 0 V), and one or more positive and/or negative supply voltages. In order to connect different conductive layers with each other and/or to one or more of the electronic components, so called vias of electrically conductive material passing through holes in the insulating layers are normally arranged in the PCBs. To e.g. reduce the impact of switching activity in digital components of the electronic circuit, capacitors connected between different supply voltages (such as between ground and a positive supply voltage) are normally provided in close proximity to the power-supply terminals of ICs in the electronic circuit for stabilizing the supply-voltage levels. Such capacitors are normally referred to as decoupling capacitors.

In order to simplify the production of electronic circuits, thereby reducing the production time and/or cost, it is desirable to keep the number of components in the electronic circuit to be mounted on the PCB relatively low.

SUMMARY

An object of the present invention is to facilitate a relatively simple production of electronic circuits.

According to a first aspect, there is provided an electronic circuit comprising a first and a second integrated circuit (IC), and a printed circuit board (PCB). The PCB comprises a first insulation layer of a first dielectric material comprising a polymer, and a second insulation layer of a second dielectric material comprising a polymer. Furthermore, the PCB comprises a first conduction layer comprising an electrically conductive material forming a first plane on a first surface of the first insulation layer for supplying a first supply voltage to the first and the second IC. Moreover, the PCB comprises a second conduction layer comprising an electrically conductive material forming a second plane on a second surface, opposite to said first surface, of the first insulation layer for supplying a second supply voltage to the first and the second IC. In addition, the PCB comprises a third conduction layer comprising an electrically conductive material forming one or more signal wires, for conveying electrical signals to and/or from the first and/or the second IC, on a surface of the second insulation layer. The PCB further comprises a first via of electrically conductive material connected to the first plane and passing through the first insulation layer for providing the first supply voltage to the first IC, and a second via of electrically conductive material connected to the first plane and passing through the first insulation layer for providing the first supply voltage to the second IC. The first dielectric material has a higher dissipation factor than the second dielectric material.

The second dielectric material may comprise epoxy resin. Furthermore, the second dielectric material may comprise a reinforcing fiber glass structure. The second dielectric material may e.g. be flame retardant 4 (FR-4).

The first dielectric material may comprise synthetic resin. Furthermore, the first dielectric material may comprise a paper material. The first dielectric material may e.g. be flame retardant 2 (FR-2).

According to a second aspect, there is provided an electronic circuit comprising a first and a second IC and a PCB. The PCB comprises a dielectric insulation layer comprising a polymer. Furthermore, the PCB comprises one or more conduction layers comprising an electrically conductive material for electrically connecting the first and the second IC to other electronic components. Moreover, the PCB comprises a first via of electrically conductive material passing through the insulation layer for connecting the first IC to one of the conduction layers, and a second via of electrically conductive material passing through the insulation layer for connecting the second integrated circuit to one of the conduction layers. The insulation layer has a first and a second region located adjacent to each other. The first and the second via pass through the first region of the insulation layer. The material of the insulation layer has a higher dissipation factor in the second region than in the first region for damping electromagnetic waves emanating from the first and/or the second via before said electromagnetic waves reenter the first region due to reflection in an edge of the insulation layer.

The second region of the insulation layer may form a frame around the first region of the insulation layer. Alternatively, the second region of the insulation layer may partly frame the first region of the insulation layer.

According to a third aspect, there is provided an electronic apparatus comprising the electronic circuit according to the first or the second aspect. The electronic apparatus may be a portable communication device, such as but not limited to a mobile telephone.

Further embodiments of the invention are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
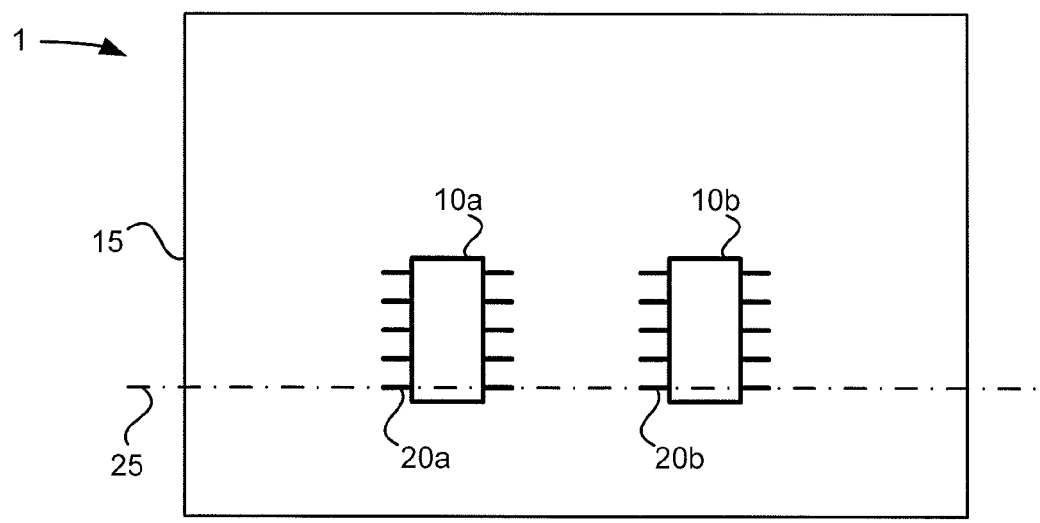
FIG. 1 is a top view of an electronic circuit according to an embodiment of the present invention.

FIG. 1 is a top view of an electronic circuit 1 according to an embodiment of the present invention. The electronic circuit 1 comprises a first integrated circuit (IC) 10a and a second IC 10b. Furthermore, the electronic circuit 1 comprises a printed circuit board 15, on which the first and second IC 10a, 10b are mounted. The first IC 10a has a power-supply terminal 20a (such as a ground terminal or a terminal for supplying a positive or negative supply voltage) and the second IC 10b has a power-supply terminal 20b. In addition, the electronic circuit 1 may comprise other electronic components (not shown), such as ICs, discrete components, and/or various types of connectors.

Figure 2:
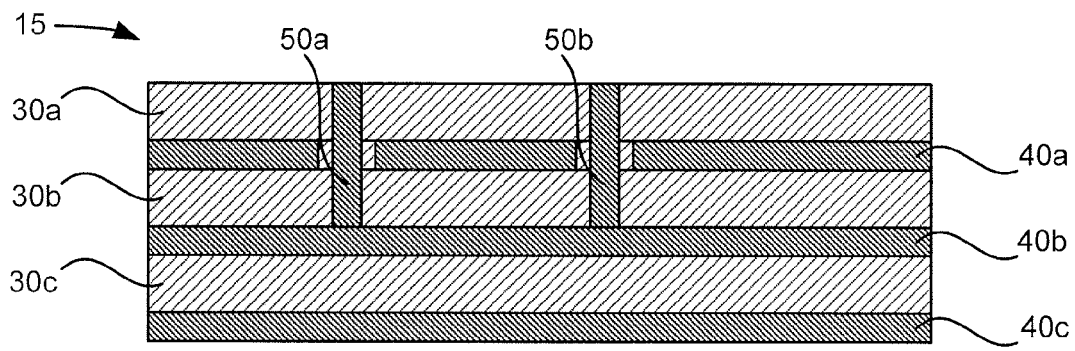
FIG. 2 is a cross-sectional view of a printed circuit board (PCB) of the electronic circuit in FIG. 1.

FIG. 2 is a cross-sectional view of the PCB 15 along the dash-dotted line 25 (FIG. 1). The PCB 15 comprises a number of insulation layers 30a-30c of dielectric material. Furthermore, the PCB 15 comprises a number of conduction layers 40a-40c. Each conduction layer comprises an electrically conductive material, normally a metal, such as copper, or metal alloy, forming electrical wires and/or planes. In FIG. 2 (and also FIG. 4), conduction layers have, for simplicity, been illustrated as being completely filled with the electrically conductive material, except for passages for vias. In reality, further parts of the conduction layers may have areas without electrically conductive material (e.g., the electrically conductive material may have been etched away), e.g. between two wires, between a wire and a plane, or between two planes, as is known to the skilled person.

In order to achieve a relatively low production cost, polymer-based dielectric materials are employed in the insulation layers 30a-c in embodiments of the present invention. The polymer-based dielectric materials may comprise a polymer resin. Furthermore, some of the polymer-based dielectric materials may comprise a reinforcing structure, e.g. of paper or fiber glass. Examples of such materials are the commonly use flame retardant 2 (FR-2) and flame retardant 4 (FR-4). FR-4 is made from an epoxy resin which is reinforced with fiber glass. FR-2 is made from a paper material which is impregnated with a synthetic resin. Using such polymer-based dielectric materials for manufacturing the insulation layers 30a-c results in a considerably lower production cost than e.g. ceramic dielectric materials. Multilayer PCBs with more than two conduction layers may be manufactured from several PCBs having two conduction layers separated by a single insulation layer (so called two-sided PCBs), which are glued together with a polymer resin. The insulation layer in each of these two-sided PCBs may be made from a reinforced polymer-based dielectric material, such as FR-2 or FR-4, whereas the insulation layers between adjacent two-sided PCB of the multilayer PCB may be formed by the polymer resin used for gluing the adjacent two-sided PCBs together.

In the embodiment illustrated in FIGS. 1-2, the electrically conductive material of the conduction layer 40b forms a first plane on a first surface of the insulation layer 30b for supplying a first supply voltage to the first and the second IC 10a, 10b. Furthermore, the electrically conductive material of the conduction layer 40a forms a second plane on a second surface, opposite to said first surface, of the insulation layer 30b for supplying a second supply voltage to the first and the second IC 10a, 10b. In some embodiments, the first supply voltage may be ground, or 0 V, and the second supply voltage may be a positive supply voltage. However, in other embodiments, it may be the other way around, or the first and/or the second supply voltage may be any other supply voltage needed in the electronic circuit 1. A plane formed in a conduction layer of a PCB for supplying a supply voltage to electronic components mounted onto the PCB, such as first and second plane mentioned above, is in the following referred to as a supply plane.

The electrically conductive material of the conduction layer 40c forms one or more signal wires, for conveying electrical signals to and/or from the first and/or the second IC 10a, 10b, on a surface of the insulation layer 30c.

The PCB 15 further comprises a first via 50a of electrically conductive material connected to the first plane and passing through the 30b for providing the first supply voltage to the first IC 10a. Furthermore, the PCB 15 comprises a second via 50b of electrically conductive material connected to the first plane and passing through the insulation layer 30b for providing the first supply voltage to the second IC 10b. The electrically conductive material in the vias is normally a metal or metal alloy.

For clocked circuitry, such as digital circuitry operating on one or more clock signals, the current drawn from the power supply typically appears as spikes with relatively large peak currents due to that a multitude of circuit nodes more or less simultaneously switches logic level when such a clock signal makes a transition. Such spikes normally induces noise, that may propagate as electromagnetic (EM) waves back and forth in the dielectric layer due to multiple reflections against PCB boundaries and other impedance discontinuities. Due to the multiple reflections, an amplification of one or more noise frequency components or ranges thereof may occur, which in turn may cause interference with proper functionality of electronic components mounted on the PCB 15, and/or may cause permitted limits on electromagnetic interference (EMI), or radio-frequency interference (RFI), to be exceeded.

Consider e.g. an example where the first IC 10a has a "spiky" current consumption as described above. The current spikes drawn from the first plane formed by the conduction layer 40b through the via 50a to the first IC 10a will induce noise in the form of EM waves in the insulation layer 30b. The induced noise will propagate and be reflected in the insulation layer 30b as described above. Furthermore, the induced noise will be picked up by the via 50b to the power supply terminal 20b of the second IC 10b. This in turn results in a fluctuating supply voltage for the second IC 10b, which may adversely affect the performance of the second IC 10b, and even cause malfunction. Decoupling capacitors may be connected between the first and the second plane in the proximity of the second IC 10b in order to reduce the supply-voltage fluctuations.

In accordance with embodiments of the present invention, it has been realized that the effects of the above-described noise may be reduced, without significantly sacrificing circuit performance, by selecting the polymer-based first and second dielectric materials such that the first dielectric material has a higher dissipation factor than the second dielectric material. Selecting the second dielectric material with a relatively low dissipation factor facilitates the use of relatively high signal frequencies (e.g. for bit-serial digital signals with relatively high bitrates) in the wires formed by the conduction layer 40c on the surface of the insulation layer 30c. A required upper limit on the dissipation factor for the second dielectric material may be different for different applications (e.g. due to different clock frequencies and/or wirelengths), and may e.g. be determined based on measurements using test circuits and/or computer simulations. At the same time, by selecting the first dielectric material with a higher dissipation factor than for the second dielectric material, the insulation layer 30b will dissipate the noise energy associated with the induced noise to a larger extent than what would be the case with if the first and the second dielectric material were the same material. As a consequence, production of the electronic circuit 1 may be simplified, e.g. in that the number of required decoupling capacitors may be reduced, and/or less extensive EMI or RFI shielding may be required.

According to an example embodiment, the second dielectric material may comprise an epoxy resin, and may further comprise a reinforcing fiber glass structure. For example, the second dielectric material may be FR-4 (described above) or a similar material. Furthermore, the first dielectric material may comprise a synthetic resin, and may further comprise a paper material, which may be impregnated with the synthetic resin. For example, the first dielectric material may be FR-2 (described above) or a similar material. FR-4 typically has a dissipation factor of approximately 0.02 at 1 MHz signal frequency, whereas FR-2 typically has a dissipation factor of approximately 0.25 at 1 MHz signal frequency, which is more than a factor 10 higher than said typical value for FR-4.

Examples of other suitable materials that may be used as the first or the second dielectric material include composite epoxy material-1 (CEM-1) with an approximate dissipation factor of 0.045, 22F with an approximate dissipation factor of 0.05, FR-1 with an approximate dissipation factor of 0.045-0.065, and XPC with an approximate dissipation factor of 0.01-0.05. All of these materials, as well as FR-2 and FR-4, are e.g. available from Midas Instrumentations, A/116, Tirthraj Complex, Ellisbridge, Ahmedabad, Gujarat-380 006, India. These materials (including FR-2 and FR-4) may be used in various embodiments as the first and the second dielectric material, such that the material selected as the first dielectric material has a higher dissipation factor than the material selected as the second dielectric material.

It should be emphasized that the embodiment illustrated in FIG. 2 is only an example. For example, the PCB 15 may have more than three conduction layers. Furthermore, more than two of the conduction layers may be utilized for forming supply planes, and more than one conduction layer may be utilized for forming wires.

Figure 3:
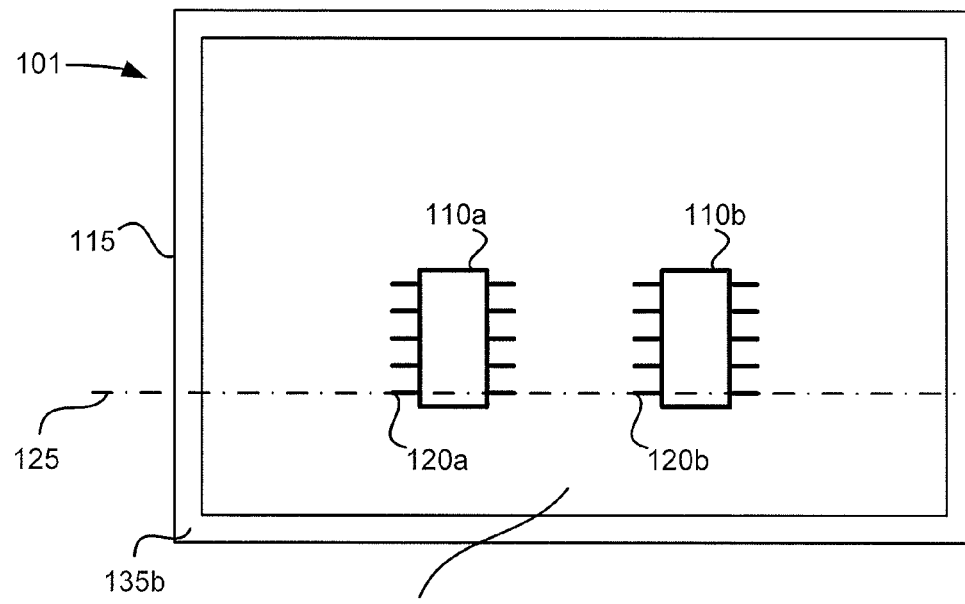
FIG. 3 is a top view of an electronic circuit according to an embodiment of the present invention.

FIG. 3 is a top view of an electronic circuit 101 according to another embodiment of the present invention. According to this embodiment, the electronic circuit 101 comprises a first IC 110a (corresponding to the first IC 10a in FIG. 1) and a second IC 110b (corresponding to the second IC 10b in FIG. 1). Furthermore, the electronic circuit 101 comprises a PCB 115, on which the first and second IC 110a, 110b are mounted. One terminal of each of the first and second IC 110a, 110b are labeled in FIG. 3 with reference signs 120a and 120b, respectively. The terminals 120a and 120b may e.g. be power supply terminals. In addition, the electronic circuit 101 may comprise other electronic components (not shown), such as ICs, discrete components, and/or various types of connectors.

Figure 4:
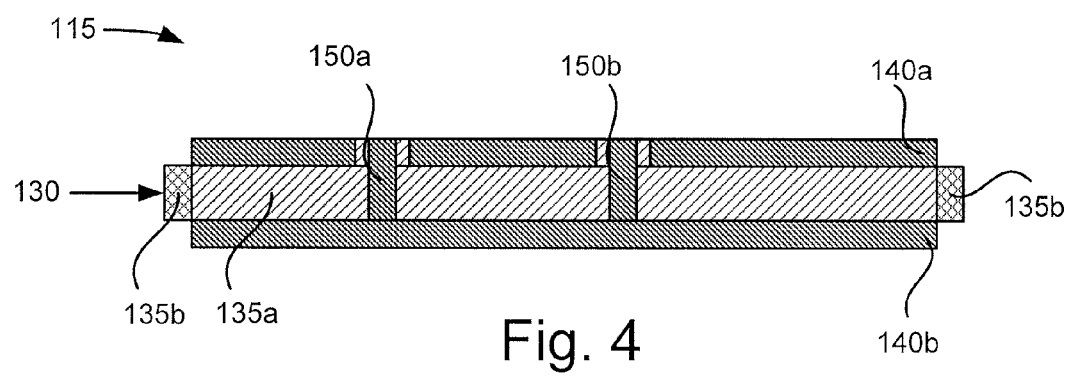
FIG. 4 is a cross-sectional view of a PCB of the electronic circuit in FIG. 3.

FIG. 4 is a cross-sectional view of the PCB 115 along the dash-dotted line 125 (FIG. 3). The PCB 115 comprises a polymer-based dielectric insulation layer 130. The insulation layer 130 has a first region 135a and a second region 135b located adjacent to each other. The regions 135a and 135b are also indicated in FIG. 3. Furthermore, the PCB 115 comprises one or more conduction layers 140a, 140b (in FIG. 3, the number of conduction layers is two, but other numbers are possible as well) comprising an electrically conductive material (such as a metal, normally copper, or a metal alloy) for electrically connecting the first and the second IC to other electronic components, such as to each other, to a power-supply source, and/or various other components. As described above with reference to FIG. 2, the electrically conductive material in the conduction layers 140a and 140b may e.g. form wires and/or planes.

The PCB 115 further comprises a first via 150a of electrically conductive material passing through the insulation layer 130 for connecting the first IC 110a to one of the conduction layers, in this case the conduction layer 140b, (through the terminal 120a of the first IC 110a). Furthermore, the PCB 115 comprises a second via 150b of electrically conductive material also passing through the insulation layer 130 for connecting the second IC 110b to one of the conduction layers, in this case the conduction layer 140b, (through the terminal 120b of the second IC). As above, the electrically conductive material in the vias 15a and 150b may e.g. be a metal or metal alloy.

In the embodiment illustrated in FIGS. 3 and 4, both the first and the second via 150a, 150b pass through the first region 135a of the insulation layer 130. As described above with reference to the embodiment illustrated in FIGS. 1 and 2, noise may emanate from one of the vias, e.g. the first via 150a, and propagate in the form of EM waves through the insulation layer 130, and further be picked up by the second via 150b, which may adversely affect the performance of the second IC 110b, and even cause malfunction.

In accordance with embodiments of the present invention, it has been realized that the effects of the above-described noise may be reduced, without significantly sacrificing circuit performance, by using material of the insulation layer 130 that has a higher dissipation factor in the second region 135b than in the first region 135a. Thereby, EM waves emanating from the first and/or the second via 150a, 150b are damped before said electromagnetic waves reenter the first region 135a due to reflection in an edge of the insulation layer 130. The damping is a result of that noise energy is dissipated when the EM waves propagate through the second region 135b. As a consequence, production of the electronic circuit 101 may be simplified, e.g. in that the number of required decoupling capacitors may be reduced, and/or less extensive EMI or RFI shielding may be required.

As illustrated in FIG. 3, the second region 135b of the insulation layer 130 may form a frame around the first region 135a of the insulation layer 130. In alternative embodiments (not shown), the second region 135b may instead only partly frame the first region 135a. For example, the second region 135b may be located adjacent to one or more of the edges of the first region 135a, but not necessarily to all edges of the first region as in FIG. 3.

The first region may e.g. be made of polymer-based dielectric material commonly used in PCBs, such as FR-2, FR-4, CEM-1, 22F, XPC, or similar material. The second region 135b may be deposited as a cladding on the edges of the first region. The cladding may e.g. comprise the same resin, or a similar resin, as the first region 135a. The cladding may additionally comprise particles of a microwave absorbing material to provide a suitable dissipation factor in the second region 135b. The type and amount of the microwave absorbing material may e.g. be selected based on measurements such as to achieve a desired dissipation factor in the second region 135b. A nonlimiting example of a suitable microwave absorbing material is carbonyl iron powder (CIP). According to some embodiments, the cladding may comprise or consist of the material Wave-X available from ARC Technologies Inc., 11 Chestnut Street, Amesbury, Mass. 01913, USA.

The PCB may e.g. be manufactured by first manufacturing a conventional PCB (i.e. without the second region 135b).

The cladding for forming the second region 135b may then, in a post processing step, be deposited around the edges of the first region 135a.

It should be emphasized that the embodiment illustrated in FIG. 4 is only an example. For example, the PCB 115 may have more than three conduction layers and insulation layers than shown in the figure. One or more of the insulation layers may have a first and second region 135a and 135b as described above. For example, the above-described cladding may be deposited such that it extends over one, or more than one, of the insulation layers, thereby forming such second regions 135b for each of the insulation layers over which it extends.

Figure 5:
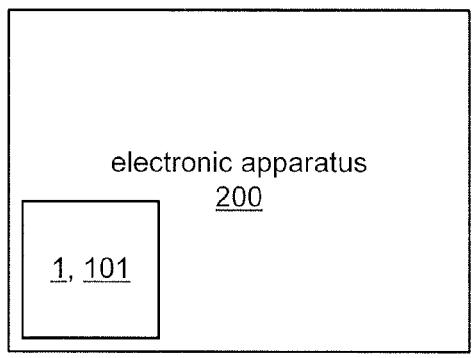
FIG. 5 schematically illustrates an electronic apparatus comprising an electronic circuit according to embodiments of the present invention.

According to some embodiments of the present invention, the electronic circuit 1 (FIG. 1) or 101 (FIG. 3) is comprised in an electronic apparatus. This is schematically illustrated in FIG. 5, showing an electronic apparatus 200 comprising the electronic circuit 1 or 101. The electronic apparatus may be, but is not limited to, a portable communication device, such as a mobile telephone or the like.

The present invention has been described above with reference to specific embodiments. However, other embodiments than the above described are possible within the scope of the invention. The different features and of the embodiments may be combined in other combinations than those described. The scope of the invention is only limited by the appended patent claims.

The invention claimed is:

1. An electronic circuit comprising:
a first and a second integrated circuit; and
a printed circuit board comprising:
a first insulation layer of a first dielectric material comprising a polymer;
a second insulation layer of a second dielectric material comprising a polymer;
a first conduction layer comprising an electrically conductive material forming a first plane on a first surface of the first insulation layer and on a first surface of the second insulation layer, the first conduction layer supplying a first supply voltage to the first and the second integrated circuit;
a second conduction layer comprising an electrically conductive material forming a second plane on a second surface, opposite to said first surface, of the first insulation layer for supplying a second supply voltage to the first and the second integrated circuit;
a third conduction layer comprising an electrically conductive material forming one or more signal wires, for conveying electrical signals to and/or from the first and/or the second integrated circuit, on a second surface, opposite to said first surface, of the second insulation layer;
a first via of electrically conductive material connected to the first plane and passing through the first insulation layer and the second conduction layer, for providing the first supply voltage to the first integrated circuit; and
a second via of electrically conductive material connected to the first plane and passing through the first insulation layer and the second conduction layer, for providing the first supply voltage to the second integrated circuit; wherein
the first dielectric material has a higher dissipation factor than the second dielectric material.

2. The electronic circuit according to claim 1, wherein the second dielectric material comprises epoxy resin.

3. The electronic circuit according to claim 2, wherein the second dielectric material comprises a reinforcing fiber glass structure.

4. The electronic circuit according to claim 2, wherein the second dielectric material is flame retardant 4, FR-4.

5. The electronic circuit according to claim 2, wherein the first dielectric material comprises synthetic resin.

6. The electronic circuit according to claim 5, wherein the first dielectric material comprises a paper material.

7. The electronic circuit according to claim 5, wherein the first dielectric material is flame retardant 2, FR-2.

8. An electronic circuit comprising:
a first and a second integrated circuit; and
a printed circuit board comprising:
a dielectric insulation layer comprising a polymer;
one or more conduction layers comprising an electrically conductive material for electrically connecting the first and the second integrated circuit to other electronic components;
a first via of electrically conductive material passing through the insulation layer for connecting the first integrated circuit to one of the conduction layers; and
a second via of electrically conductive material passing through the insulation layer for connecting the second integrated circuit to one of the conduction layers; wherein
the insulation layer has a first and a second region located adjacent to each other;
the first and the second via pass through the first region of the insulation layer;
the material of the insulation layer has a higher dissipation factor in the second region than in the first region for damping electromagnetic waves emanating from the first and/or the second via before said electromagnetic waves reenter the first region due to reflection in an edge of the insulation layer; and
the second region does not have a common surface with the one or more conduction layers.

9. The electronic circuit according to claim 8, wherein the second region of the insulation layer forms a frame around the first region of the insulation layer.

10. The electronic circuit according to claim 8, wherein the second region of the insulation layer partly frames the first region of the insulation layer.

11. An electronic apparatus comprising the electronic circuit according to claim 8.

12. The electronic apparatus according to claim 11, wherein the electronic apparatus is a portable communication device.

13. The electronic apparatus according to claim 12, wherein the portable communication device is a mobile telephone.

* * * * *